United States Patent
Astle et al.

(10) Patent No.: US 9,403,236 B2
(45) Date of Patent: Aug. 2, 2016

(54) REMOVAL OF SELECTED PORTIONS OF PROTECTIVE COATINGS FROM SUBSTRATES

(71) Applicant: HzO, Inc., Draper, UT (US)

(72) Inventors: David James Astle, Park City, UT (US); Tyler Christensen Child, South Jordan, UT (US); Vimal Kumar Kasagani, Taylorsville, UT (US); Cameron LaMar Loose, Roy, UT (US); Blake LeRoy Stevens, Morristown, NJ (US); Max Ernest Sorenson, Cottonwood Heights, UT (US)

(73) Assignee: HZO, Inc., Draper, UT (US)

( * ) Notice: Subject to any disclaimer, the term of this patent is extended or adjusted under 35 U.S.C. 154(b) by 0 days.

(21) Appl. No.: 14/157,743

(22) Filed: Jan. 17, 2014

(65) Prior Publication Data
US 2014/0190931 A1   Jul. 10, 2014

Related U.S. Application Data

(63) Continuation of application No. PCT/US2014/010510, filed on Jan. 7, 2014.

(60) Provisional application No. 61/750,257, filed on Jan. 8, 2013, provisional application No. 61/750,254, filed on Jan. 8, 2013.

(51) Int. Cl.
*H05K 3/28* (2006.01)
*B23K 26/36* (2014.01)
(Continued)

(52) U.S. Cl.
CPC .......... *B23K 26/362* (2013.01); *B23K 26/0622* (2015.10); *B23K 26/082* (2015.10); *B23K 26/402* (2013.01); *C23C 14/042* (2013.01);
(Continued)

(58) Field of Classification Search
CPC combination set(s) only.
See application file for complete search history.

(56) References Cited

U.S. PATENT DOCUMENTS

| 3,661,641 A | 5/1972 | Vigh et al. |
| 3,670,091 A | 6/1972 | Frantz et al. |

(Continued)

FOREIGN PATENT DOCUMENTS

| CN | 1826710 A | 8/2006 |
| CN | 101442896 A | 5/2009 |

(Continued)

OTHER PUBLICATIONS

United States Patent and Trademark Office Acting As the International Searching Authority, "International Search Report and Written Opinion," mailed Aug. 21, 2014 in related international application No. PCT/US2014/010510.
Christina Schmiedel et al., "Combined Plasma Laser Removal of Parylene Coatings," ISPC Conference, 2009, Bochum, Germany, accessible online www.ispc-conference.org/ispcproc/papers/239.pdf.
Office Action for Japanese Patent Application No. 2014-55684, dated Oct. 23, 2015.

(Continued)

*Primary Examiner* — Duy Deo
*Assistant Examiner* — Erin Bergner
(74) *Attorney, Agent, or Firm* — Rajesh Vallabh; Foley Hoag LLP

(57) ABSTRACT

A method for selectively removing portions of a protective coating from a substrate, such as an electronic device, includes removing portions of the protective coating from the substrate. The removal process may include cutting the protective coating at specific locations, then removing desired portions of the protective coating from the substrate, or it may include ablating the portions of the protective coating that are to be removed. Coating and removal systems are also disclosed.

28 Claims, 6 Drawing Sheets

(51) Int. Cl.
*C23C 14/04* (2006.01)
*C23C 16/04* (2006.01)
*H01L 21/56* (2006.01)
*B23K 26/40* (2014.01)
*H01L 23/31* (2006.01)

(52) U.S. Cl.
CPC ............ *C23C 16/042* (2013.01); *H01L 21/561* (2013.01); *H05K 3/288* (2013.01); *H01L 23/3121* (2013.01); *H01L 2924/0002* (2013.01); *H05K 3/285* (2013.01); *H05K 2203/025* (2013.01); *H05K 2203/092* (2013.01); *H05K 2203/095* (2013.01); *H05K 2203/107* (2013.01); *H05K 2203/1105* (2013.01); *H05K 2203/163* (2013.01)

(56) References Cited

U.S. PATENT DOCUMENTS

| | | | |
|---|---|---|---|
| 4,059,708 A | | 11/1977 | Heiss, Jr. et al. |
| 4,234,357 A | | 11/1980 | Scheppele |
| 4,254,174 A | | 3/1981 | Flanders et al. |
| 4,255,469 A | | 3/1981 | McGinness |
| 4,300,184 A | | 11/1981 | Colla |
| 4,495,254 A | | 1/1985 | Hoffman |
| 4,631,250 A | * | 12/1986 | Hayashi .................. 430/329 |
| 4,784,310 A | | 11/1988 | Metzger et al. |
| 4,814,943 A | | 3/1989 | Okuaki |
| 5,009,311 A | | 4/1991 | Schenk |
| 5,024,879 A | | 6/1991 | Massa et al. |
| 5,102,712 A | | 4/1992 | Peirce et al. |
| 5,176,312 A | | 1/1993 | Lowenthal |
| 5,184,427 A | * | 2/1993 | Armstrong ................ 451/7 |
| 5,188,669 A | | 2/1993 | Donges et al. |
| 5,246,730 A | | 9/1993 | Peirce et al. |
| 5,271,953 A | | 12/1993 | Litteral |
| 5,456,955 A | | 10/1995 | Muggli |
| 5,536,282 A | | 7/1996 | Yoon et al. |
| 5,543,008 A | | 8/1996 | Hidber et al. |
| 5,587,207 A | | 12/1996 | Gorokhovsky |
| 5,888,308 A | | 3/1999 | Sachdev et al. |
| 5,925,069 A | | 7/1999 | Graves et al. |
| 6,060,683 A | | 5/2000 | Estrada |
| 6,138,349 A | * | 10/2000 | Vinciarelli et al. .......... 29/841 |
| 6,280,821 B1 | | 8/2001 | Kadunce et al. |
| 6,447,847 B1 | | 9/2002 | Hynes et al. |
| 6,592,018 B2 | | 7/2003 | Taylor et al. |
| 6,635,510 B1 | | 10/2003 | Kraft et al. |
| 6,635,553 B1 | | 10/2003 | DiStefano et al. |
| 6,697,217 B1 | | 2/2004 | Codilian |
| 6,793,544 B2 | | 9/2004 | Brady et al. |
| 6,940,022 B1 | | 9/2005 | Vinciarelli et al. |
| 6,956,963 B2 | | 10/2005 | Ulrich et al. |
| 6,980,647 B1 | | 12/2005 | Daugherty et al. |
| 7,109,055 B2 | | 9/2006 | McDonald et al. |
| 7,273,767 B2 | | 9/2007 | Ong et al. |
| 7,632,698 B2 | | 12/2009 | Hooper et al. |
| 7,681,778 B2 | | 3/2010 | Gottshall et al. |
| 7,897,881 B2 | | 3/2011 | Kaspar et al. |
| 8,002,948 B2 | | 8/2011 | Haubrich et al. |
| 3,408,379 A1 | | 4/2013 | Malek et al. |
| 8,544,781 B2 | | 10/2013 | Pan et al. |
| 2002/0088636 A1 | | 7/2002 | Noguchi et al. |
| 2002/0170897 A1 | * | 11/2002 | Hall .................. 219/121.73 |
| 2002/0187260 A1 | * | 12/2002 | Sheppard et al. .......... 427/248.1 |
| 2003/0143845 A1 | | 7/2003 | Mori et al. |
| 2004/0056039 A1 | | 3/2004 | Sarajian |
| 2004/0058070 A1 | | 3/2004 | Takeuchi et al. |
| 2004/0065554 A1 | | 4/2004 | Cohen |
| 2004/0100164 A1 | | 5/2004 | Murata et al. |
| 2005/0008848 A1 | | 1/2005 | Saccomanno et al. |
| 2005/0081354 A1 | | 4/2005 | Motzno et al. |
| 2005/0179140 A1 | | 8/2005 | Goodner et al. |
| 2006/0013961 A1 | | 1/2006 | Fournier et al. |
| 2006/0042659 A1 | | 3/2006 | Fernandez et al. |
| 2006/0199408 A1 | | 9/2006 | Hoisington et al. |
| 2006/0264153 A1 | | 11/2006 | Jaubertie |
| 2007/0087131 A1 | | 4/2007 | Hutchinson et al. |
| 2007/0095368 A1 | | 5/2007 | Girard et al. |
| 2007/0157457 A1 | | 7/2007 | Fried |
| 2007/0206365 A1 | | 9/2007 | Shiu et al. |
| 2007/0246820 A1 | | 10/2007 | Zohni et al. |
| 2008/0147158 A1 | | 6/2008 | Zweber et al. |
| 2008/0283180 A1 | * | 11/2008 | Bachman et al. ............. 156/221 |
| 2009/0263581 A1 | | 10/2009 | Martin, III et al. |
| 2009/0263641 A1 | | 10/2009 | Martin, III et al. |
| 2009/0283574 A1 | | 11/2009 | Okazaki et al. |
| 2009/0301770 A1 | | 12/2009 | Cho et al. |
| 2009/0304549 A1 | | 12/2009 | Coulson |
| 2010/0124010 A1 | | 5/2010 | Shiu et al. |
| 2010/0159699 A1 | * | 6/2010 | Takahashi .................... 438/693 |
| 2010/0203347 A1 | | 8/2010 | Coulson |
| 2010/0277921 A1 | | 11/2010 | Sekowski et al. |
| 2010/0293812 A1 | | 11/2010 | Coulson |
| 2011/0090658 A1 | | 4/2011 | Adams et al. |
| 2011/0094514 A1 | | 4/2011 | Rakow et al. |
| 2011/0141205 A1 | | 6/2011 | Gerner et al. |
| 2011/0231002 A1 | | 9/2011 | Vienot et al. |
| 2011/0253429 A1 | | 10/2011 | Humphries et al. |
| 2011/0262740 A1 | | 10/2011 | Martin, III et al. |
| 2012/0070145 A1 | | 3/2012 | Wong et al. |
| 2012/0146212 A1 | | 6/2012 | Daubenspeck et al. |
| 2012/0193648 A1 | | 8/2012 | Donofrio et al. |
| 2012/0296032 A1 | | 11/2012 | Legein et al. |
| 2013/0174410 A1 | | 7/2013 | Stevens et al. |
| 2013/0176691 A1 | | 7/2013 | Stevens et al. |
| 2013/0176700 A1 | | 7/2013 | Stevens et al. |
| 2013/0251889 A1 | | 9/2013 | Cox et al. |
| 2013/0286567 A1 | | 10/2013 | Sorenson et al. |
| 2013/0335898 A1 | | 12/2013 | Stevens et al. |

FOREIGN PATENT DOCUMENTS

| | | |
|---|---|---|
| CN | 102171852 A | 8/2011 |
| EP | 0350031 A2 | 1/1990 |
| EP | 0474194 A2 | 3/1992 |
| JP | 62-248228 | 10/1987 |
| JP | 07-302808 A | 11/1995 |
| JP | 2000-299066 A | 10/2000 |
| JP | 2002-043702 A | 2/2002 |
| JP | 2005-079225 A | 3/2005 |
| JP | 2005-172083 A | 6/2005 |
| JP | 2005-260106 A | 9/2005 |
| JP | 2007-279616 A | 10/2007 |
| JP | 2008-018476 A | 1/2008 |
| JP | 2009-505386 A | 2/2009 |
| JP | 2009-178805 A | 8/2009 |
| JP | 2009-292135 A | 12/2009 |
| JP | 2010-225715 A | 10/2010 |
| JP | 2012-500487 A | 1/2012 |
| WO | 2007/138302 A1 | 12/2007 |
| WO | 2010020753 A2 | 2/2010 |
| WO | 2011/037921 A1 | 3/2011 |
| WO | 2011/089009 A1 | 7/2011 |
| WO | 2012/106109 A1 | 8/2012 |
| WO | 2013/106442 A1 | 7/2013 |
| WO | PCT/US14/10638 | 1/2014 |
| WO | 2014/110039 A2 | 7/2014 |

OTHER PUBLICATIONS

Chinese State Intellectual Property Office, "Notification of the First Office Action and Search Report," mailed Jun. 2, 2015 in Chinese application No. 201480000037.2.

Chinese State Intellectual Property Office, "Notification of the Second Office Action and Search Report," mailed Apr. 4, 2016 in Chinese application No. 201480000037.2.

European Search Report for EP14700800.7, dated Oct. 14, 2015.

* cited by examiner

REMOVAL OF SELECTED PORTIONS OF PROTECTIVE COATINGS FROM SUBSTRATES

CROSS-REFERENCE TO RELATED APPLICATIONS

This application is a continuation of International Patent Application No. PCT/US2014/010510, which was filed pursuant to the Patent Cooperation Treaty on Jan. 7, 2014, titled REMOVAL OF SELECTED PORTIONS OF PROTECTIVE COATINGS FROM SUBSTRATES. The '510 PCT Application claims the benefit of the Jan. 8, 2013, filing dates of U.S. Provisional Patent Application no. 61/750,257, titled METHODS FOR REMOVING PROTECTIVE COATING FROM AREAS OF AN ELECTRONIC DEVICE ("the '257 Provisional Application"), and U.S. Provisional Patent Application No. 61/750,254, titled METHODS FOR MASKING ELECTRONIC DEVICES FOR APPLICATION OF PROTECTIVE COATINGS AND MASKED ELECTRONIC DEVICES ("the '254 Provisional Application"). The entire disclosure of each of the foregoing patent applications is hereby incorporated herein.

TECHNICAL FIELD

This disclosure relates generally to methods and systems for selectively removing portions of protective coatings (such as water-resistant coatings) from components of electronic devices, electronic subassemblies, electronic assemblies and electronic devices to enable the protective coatings to protect the coated elements while enabling a coated electronic device to operate properly.

RELATED ART

The durability of electronic devices is often a concern to consumers, particularly with state-of-the-art portable electronic devices due to their cost and the extent to which consumers typically rely on the electronic devices. Accordingly, protective covers and protective cases for portable electronic devices, such as cellular telephones, tablet computers, laptop computers, and other electronic devices are in high demand. Many protective covers and cases prevent scratches and other physical damage to electronic devices, but protective covers typically provide little, if any protection from water and other types of moisture, and few protective cases protect portable electronic devices from damage that may be caused by water and other types of moisture. Protective cases that provide protection against water damage generally do so by ensuring that the electronic device is not exposed to water; a typical waterproof protective case envelops the entire electronic device. As a result, waterproof cases are often somewhat bulky, or large, and may limit access to certain features of the electronic device and, thus, hinder an individual's ability to use the electronic device in the manner desired by the individual.

Some companies, such as HzO, Inc., take a different approach to protecting electronic devices from water, other types of moisture and contamination. HzO's approach employs the application of a thin film, or protective coating, to various components inside the electronic device. This protective coating limits exposure of coating components of the electronic device to water, other types of moisture and contamination without the need for a bulky protective case on the outside of the electronic device. Such a protective coating may protect the electronic device even if it is dropped in water, rained on, or otherwise exposed to damaging levels of moisture.

While protective coatings may limit exposure of coated features to water, other types of moisture or contaminants, protective coatings may also adversely affect the performance of some features of an electronic device. For example, a protective coating may reduce the resolution and clarity of the display and any camera lenses of the electronic device. A protective coating could also interfere with electrical contacts, such as battery terminals, connector pins, etc. The protective coating may also negatively impact the performance of certain parts, such as moving parts (e.g., vibration elements, etc.), microphones, speakers, lenses and the like. In addition, a protective coating could trap undesirable heat within electronic components (e.g., semiconductor device, etc.), decreasing their reliability and the speed with which they operate.

One approach for achieving selectivity in the manner in which a substrate, such as an electronic device, is coated includes masking. Masking may prevent a protective coating from adhering to certain features of a substrate. Nonetheless, masking introduces additional pre-coating steps and can also add to the cost and time required to manufacture or protect a substrate. In addition, post-coating processes, including mask removal and removal of portions of the protective coating located over the mask, are also required, adding to the cost and time of applying the protective coating.

SUMMARY

This disclosure, in one aspect, relates to approaches for removing a protective coating from selected portions, or "removal areas," of a substrate (e.g., from selected components or features of a subassembly or an assembly of an electronic device, such as a consumer electronic device; etc.) while leaving other portions of the protective coating in place over other, "protected areas" of the substrate. The protective coating may comprise a moisture-resistant coating. By selectively removing portions of the protective coating, it may beneficially provide protection to the substrate (e.g., from exposure to potentially harmful levels of moisture, etc.) without impeding the performance of various components or features (e.g., electrical contacts, moving parts, audio transmission elements, displays, lenses, etc., of an electronic device).

A method for protecting a substrate may involve applying a protective coating to a plurality of components or features of a substrate, such as an assembly or subassembly of an electronic device. Initially, the coated components or features may include electronic components (e.g., printed circuit boards (PCBs), semiconductor devices, electrical connections, electrical connectors, displays, audio components, other devices, buttons, switches, ports, etc.). The protective coating may be applied using processes (e.g., chemical vapor deposition (CVD), molecular diffusion, physical vapor deposition (PVD) (e.g., evaporation deposition (including, but not limited to e-beam evaporation, sputtering, laser ablation, pulsed laser deposition, etc.), atomic layer deposition (ALD), and physical application processes (e.g., printing, spray-on techniques, rolling, brushing, etc.), etc.) that are non-selective and non-directional, resulting in exposed components or features being coated regardless of whether or not it is ultimately desirable to coat every component or feature of the substrate. Such a method also includes removing portions of the protective coating from a subset of the components or features that were initially coated, such as components or features whose performance may be impeded by the protective coating, including, but not limited to, components or features that require little or no protection from water, other types of moisture or other contaminants.

In some embodiments, selective removal of portions of a protective coating may comprise a focused, directional process, in which portions of the protective coating that are in the path of a directed removal medium are cut, and then removed from the substrate, while the other portions of the protective coating remain in place over the substrate. The term "cut," as used herein, includes severed or weakened locations of a protective coating. A source of the directed removal medium may be connected to a positioning mechanism that moves the source between various positions associated with the components or features from which portions of a protective coating are to be removed in order to facilitate automated removal of the selected portions of the protective coating.

In various embodiments, the directed removal medium may comprise an abrasive material, which may be in a particulate form, such as solid carbon dioxide, which is commonly referred to as "dry ice." Other suitable abrasive materials include, without limitation, starch and sand (which includes, but is not limited to particulate silicon dioxide, particulate glass, particulate ceramics, particles of natural stone, etc.). The abrasive material may be directed toward the substrate and the protective coating thereon in a directional manner, such that portions of the protective coating that are in the path of the abrasive material are removed from the substrate.

In another embodiment, the directed removal medium may comprise a narrow laser beam. More specifically, the laser beam may be a narrow, 266 nanometer (nm) wavelength laser beam generated by a diode-pumped solid-state (DPSS) laser. In another specific embodiment, the laser beam may be a narrow, 248 nm wavelength laser beam generated by an excimer, or exciplex, laser. Use of a narrow laser beam as the directed removal medium may enable precise removal of one or more selected portions of the protective coating from each component not intended to be coated.

Other embodiments of focused, or directed removal media include atmospheric plasma, ion beams, heated elements, or tools (e.g., heated tips, heated edges of cutting dies or stamps, etc.), jets or high pressure curtains of removal media (including particulate removal media, liquid removal media, etc.) and the like.

Once the protective coating has been cut, the cut portions thereof may be removed from the substrate.

As an alternative to the use of focused, directional processes, less focused, unfocused and/or non-directional removal techniques (e.g., non-directional ablation with an abrasive material, use of a wide laser beam, plasma etching, etc.) may be used in conjunction with a template positioned over the substrate and the protective coating thereon to remove portions of a protective coating by ablation. The template may expose one or more portions of the protective coating that are to be removed (for example, one or more portions of the protective coating that are located over those components or features that will ultimately remain uncoated by the protective coating). The template may shield those components or features that are intended to remain covered by the protective coating. In such an embodiment, the removal medium need to be applied directionally since the template prevents the removal medium from removing the protective coating from components or features that are meant to be coated.

In other embodiments, a template may be used along with the use of a directed removal medium to enhance the precision of the removal process (e.g., to ensure that stray particles of the removal medium do not damage portions of the protective coating that are to remain on the substrate, etc.).

Other aspects, as well as the features and advantages of various aspects, of the disclosed subject matter will become apparent to those of ordinary skill in the art from the ensuing description, the accompanying drawings, and the appended claims.

DETAILED DESCRIPTION

Figure 1A:
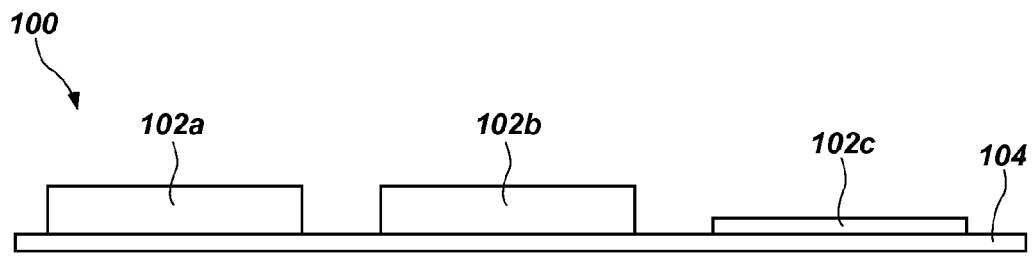
FIGS. 1A through 1C represent a substrate that includes one or more components or features covered with a protective coating, and a removal element for selectively removing a portion of the protective coating.
Figure 1B:
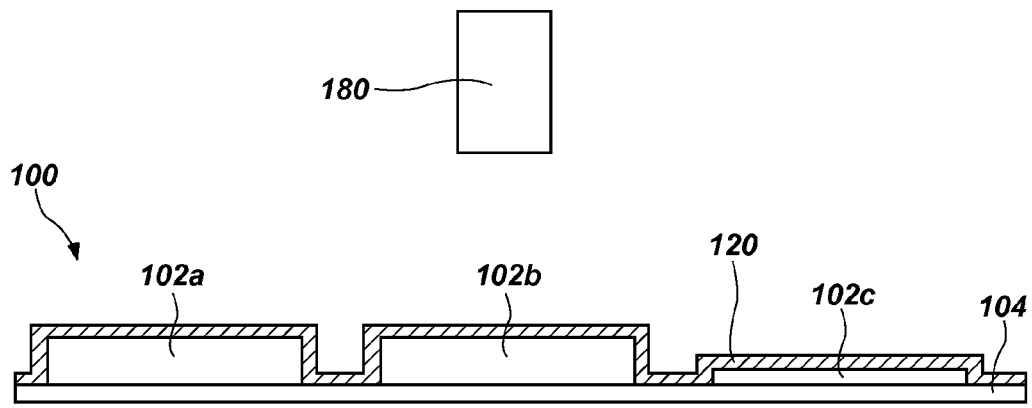
Figure 1C:
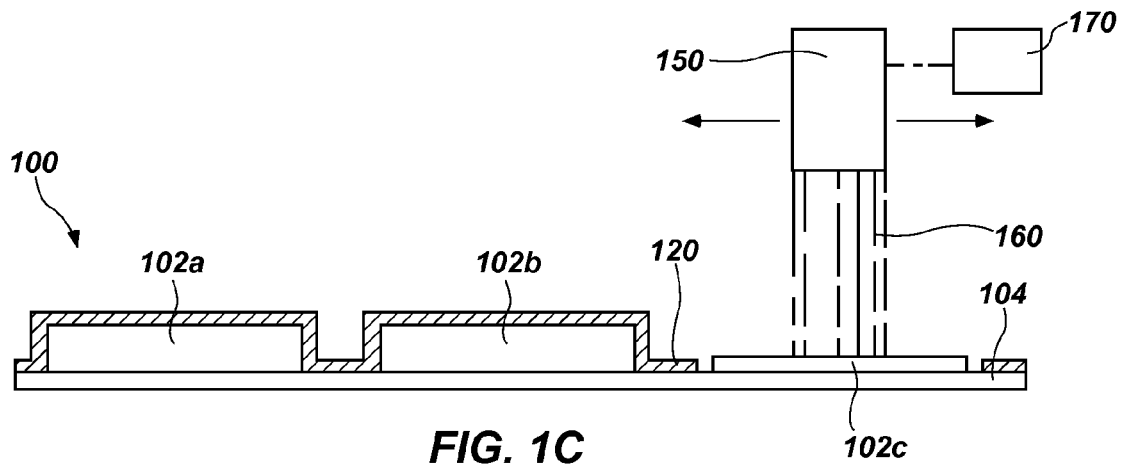

FIGS. 1A through 1C illustrate an embodiment of a substrate 100. In the depicted embodiment, the substrate 100 comprises a subassembly or an assembly of an electronic device. The substrate 100 may comprise all or part of a portable electronic device, such as a cellular telephone, a tablet computer, a camera, a global positioning system (GPS) receiver, a laptop computer, or any other electronic device. In an embodiment where the substrate 100 comprises a subassembly of an electronic device, it may include a printed circuit board (PCB) or other carrier 104 and one or more components or features 102a-c (e.g., semiconductor devices (e.g., processors, microcontrollers, memory devices, etc.), resistors, capacitors, ports, connectors, electrical contacts, buttons, switches, other components or features, etc.) on the carrier 104. In embodiments where the substrate 100 comprises a subassembly of an electronic device, it may also include other components, such as a display screen, all or part of a housing, or input/output elements. In another embodiment, the substrate 100 may comprise an entire electronic device.

As used herein, the terms "component" and "feature" are used broadly to encompass a variety of elements of a substrate 100, such as an electronic device. Certain components or features 102a-c may benefit from being covered or shielded by a protective coating (e.g., to prevent their exposure to moisture, contamination, etc.). However, a protective coating may adversely affect the operation or performance of other components or features 102a-c. Accordingly, it may be desirable to ultimately leave some components or features 102a-c uncoated.

FIG. 1B illustrates a coating element 180 that applies a protective coating 120 to an embodiment of a substrate 100 that includes a carrier 104, and to components or features 102a-c of the carrier 104 and/or carried thereby. The areas of the substrate 100 that are covered with the protective coating 120 may be referred to herein as "coated areas."

The coating element 180 may comprise any of, or any combination of, a variety of embodiments of coating apparatuses. In some embodiments, the coating element 180 may be configured to apply a protective coating 120 having a sufficient thickness to provide a desired level of moisture resistance within a relatively short period of time. In various embodiments, a coating element 180 may be configured to deposit a film (e.g., a parylene film, etc.) having a minimum thickness or an average thickness of at least one micron in less than an hour, in about fifteen minutes or less, in about five minutes or less, or even in about two minutes or less.

Various embodiments of apparatuses that may be employed as a coating element 180 of an assembly system include, without limitation, molecular diffusion equipment, chemical vapor deposition (CVD) equipment, physical vapor deposition (PVD) equipment (e.g., devices that employ evaporation deposition processes (including, but not limited to e-beam evaporation, sputtering, laser ablation, pulsed laser deposition, etc.), atomic layer deposition (ALD) equipment, and physical application apparatuses (e.g., printing equipment, spray-on equipment, roll-on equipment, brush-on apparatuses, etc.). Of course, other embodiments of coating elements 180 may also be used in an assembly system.

In a specific embodiment, a coating element 180 of an assembly system may comprise an apparatus that forms reactive monomers, which monomers may then be deposited onto and form polymers on one or more surfaces that are to be made moisture-resistant (e.g., water-resistant, waterproof, etc.). In specific embodiments, the coating element 180 may be configured to deposit a protective coating 120 of a poly(p-xylylene) (i.e., parylene), including unsubstituted and/or substituted units, onto one or more surfaces that are to be rendered moisture-resistant. Examples of protective coatings 120 that function in this manner are described by U.S. patent application Ser. Nos. 12/104,080, 12/104,152 and 12/988,103, the entire disclosure of each of which is hereby incorporated herein. U.S. patent application Ser. Nos. 12/446,999, 12/669,074 and 12/740,119, the entire disclosures of all of which are, by this reference, incorporated herein, also disclose embodiments of equipment and/or processes that may be employed by a coating element 180 of an assembly system to form protective coatings 120.

Other materials that may be applied by a coating element 180 to form the protective coating 120 include, but are not limited to, thermoplastic materials, curable materials (e.g., radiation-curable materials, two-part materials, thermoset materials, room-temperature curable materials, etc.). A protective coating 120 may also be formed from an inorganic material, such as a glass or a ceramic material. A CVD or an ALD process may, in specific embodiments, be used for depositing a protective coating 120 comprising aluminum oxide ($Al_2O_3$) or a protective coating 120 consisting substantially of aluminum oxide.

Some techniques for applying a protective coating 120 are non-directional; that is, the protective coating 120 is applied non-selectively and adheres to all areas of a substrate that are exposed to the coating material(s). For example, using CVD processes, material that deposits on components 102a and 102b will also cover component 102c.

In the context of an entire assembly system, a plurality of different coating elements 180, and even different types of coating elements 180, may be used and, optionally, incorporated into the organization of the assembly system to provide desired types of protective coatings 120 on different types of features. Without limitation, one coating element 180 may be configured to provide protective coating 120 in small spaces between different components or features 102a-c of a substrate, such as an electronic device under assembly (e.g., between surface mount technology (SMT) components and a circuit board, etc.), while another coating element 180 may be configured to provide a conformal, blanketed protective coating 120 on surfaces that are exposed during the coating process, and another coating element 180 may selectively apply a second protective coating 120 to certain other components or features 102a-c.

The protective coating 120 may provide moisture resistance to the substrates 100, or at least to selected components or features thereof, once the protective coating 120 is applied, as seen in FIG. 1B. A moisture-resistant protective coating 120 may prevent electrical shorting and/or corrosion of one or more components or features 102a-c of the substrate 100 in the event the substrate 100 is exposed to potentially damaging levels of moisture.

Any of a variety of metrics may be used to quantify the moisture resistance of each protective coating 120. For example, the ability of a protective coating 120 to physically inhibit water or other moisture from contacting a coated feature may be considered to impart the protective coating 120 with moisture resistance.

As another example, the water resistance or, more broadly, the moisture resistance of a protective coating 120 may be based on more quantifiable data, such as the rate at which water permeates through the protective coating 120, or its water vapor transfer rate, which may be measured using known techniques in units of $g/m^2/day$ or in units of $g/100$ $in^2/day$ (e.g., less than 2 $g/100$ $in^2/day$, about 1.5 $g/100$ $in^2/day$ or less, about 1 $g/100$ $in^2/day$ or less, about 0.5 $g/100$ $in^2/day$ or less, about 0.25 $g/100$ $in^2/day$ or less, about 0.15 $g/100$ $in^2/day$ or less, etc., through a film having a minimum thickness or an average thickness of about 1 mil (i.e., about 25.4 μm), at a temperature of 37° C. and at a relative humidity of 90%).

Another way in which the moisture resistance of a protective coating 120 may be determined is by the water contact angle of a droplet of water that has been applied to a surface of the protective coating 120 by an acceptable technique (e.g., the static sessile drop method, the dynamic sessile drop method, etc.). The hydrophobicity of the surface may be measured by determining the angle the base of the water droplet makes with the surface, from beneath a base of the water droplet; for example, using the Young equation, i.e.:

$$\theta_C = \arccos \frac{r_A \cos\theta_A + r_R \cos\theta_R}{r_A + r_R},$$

where $\theta_A$ is the highest, or advancing, contact angle; $\theta_R$ is the lowest, or receding, contact angle;

$$r_A = \sqrt[3]{\frac{\sin^3\theta_A}{2 - 3\cos\theta_A + \cos^3\theta_A}} \text{; and}$$

$$r_R = \sqrt[3]{\frac{\sin^3\theta_R}{2 - 3\cos\theta_R + \cos^3\theta_R}}.$$

If the surface is hydrophilic, the water will spread somewhat, resulting in a water contact angle of less than 90° C. with the surface. In contrast, a hydrophobic surface, which, for purposes of this disclosure, may be considered to be water-resistant or, more broadly, moisture-resistant, will prevent the water from spreading, resulting in a water contact angle of 90° C. or greater. The more the water beads on a surface, the greater the water contact angle. When water droplets bead on a surface such that the water contact angle with the surface is about 120° C. or more, the surface is considered to be highly hydrophobic. When the angle at which water contacts a surface exceeds 150° C. (i.e., a water droplet on the surface is nearly spherical), the surface is said to be "superhydrophobic."

Of course, other measures of water resistance or other types of moisture resistance may also be employed. While the coating element(s) 180 of an assembly system may be configured to apply a protective coating 120 to exterior surfaces of one or more components or features 102*a-c* of a substrate 100, such as an electronic device under assembly, when the substrate 100 is incorporated into a fully assembled device (e.g., an electronic device, etc.), one or more surfaces on which a protective coating 120 resides may be located within an interior of the substrate. Thus, an assembly system may be configured to assemble an electronic device that includes a protective coating 120 on internal surfaces, or an internally confined protective coating 120.

Once a protective coating 120 has been applied to a substrate 100, portions of the protective coating 120 may be removed from some components or features 102*a-c* of the substrate 100, exposing these components or features 102*a-c* through, or rendering them uncoated by, the protective coating 120. For example, and without limiting the scope of the disclosed subject matter, in embodiments where the substrate 100 is an electronic device, if the protective coating 120 comprises a dielectric material that inhibits electrical signals from passing therethrough, and the component or feature 102*c* covered by the protective coating 120 is an electrical connector for facilitating communications (e.g., the D+ or D− pins in a universal serial bus (USB) port, etc.), the protective coating 120 may impede the ability of the component or feature 102*c* to receive and/or send electrical signals. As another non-limiting example, portions of a protective coating 120 that overlie displays, lenses and/or other optical features may impede the optical clarity of such features. A protective coating 120 that covers audio components, such as speakers or microphones, may also diminish the quality of sound or audio signals produced by the audio components. Protective coatings 120 may also interfere with the ability of moving parts, such as silent signals (e.g., vibration elements, etc.), buttons or switches, to function as intended. Protective coatings 120 may also trap heat in various components (e.g., semiconductor devices, etc.), adversely affecting their performance. There are many other instances where it may not be desirable to coat a component 102*c* with the protective coating 120.

FIG. 1C illustrates a removal element 150 directing a removal medium 160 toward a component or feature 102*c* to remove the protective coating 120 from the component or feature 102*c*. While FIG. 1C illustrates the removal of the protective coating 120 from only one component or feature 102*c*, the removal element 150 may remove the protective coating 120 from any number of components or features 102. The removal element 150 may be used to remove the protective coating 120 from components or features 102 that have been directly or intentionally coated (e.g., components or features 102 that were coated as the result of the use of blanket deposition processes to form the protective coating 120, etc.), and from components or features 102 that have been indirectly or incidentally coated (e.g., components or features 102 that were masked during the coating process, components or features 102 to which the material of the protective coating 120 was not supposed to have been applied, etc., as shown in FIG. 3).

The removal element 150 may be configured to remove portions of the protective coating 120 from the component or feature 102*c* by ablation. As used herein, the term "ablation" includes a variety of forms of material removal, such as laser ablation, abrasive blasting, and other material removal techniques.

The removal element 150 may apply a removal medium 160 in a manner that removes the protective coating 120 from certain, selected areas (referred to herein as removal areas) of the substrate 100. The removal element 150 may selectively apply the removal medium 160 such that the protective coating 120 is removed from only those components or features (e.g., component or feature 102*c* in FIG. 1C) targeted by the removal element 150. For example, the removal medium 160 may be applied to areas of the protective coating 120 that are located over components or features 102 that are to be exposed through the protective coating 120, and from which the protective coating 120 is to be removed.

Figure 2:
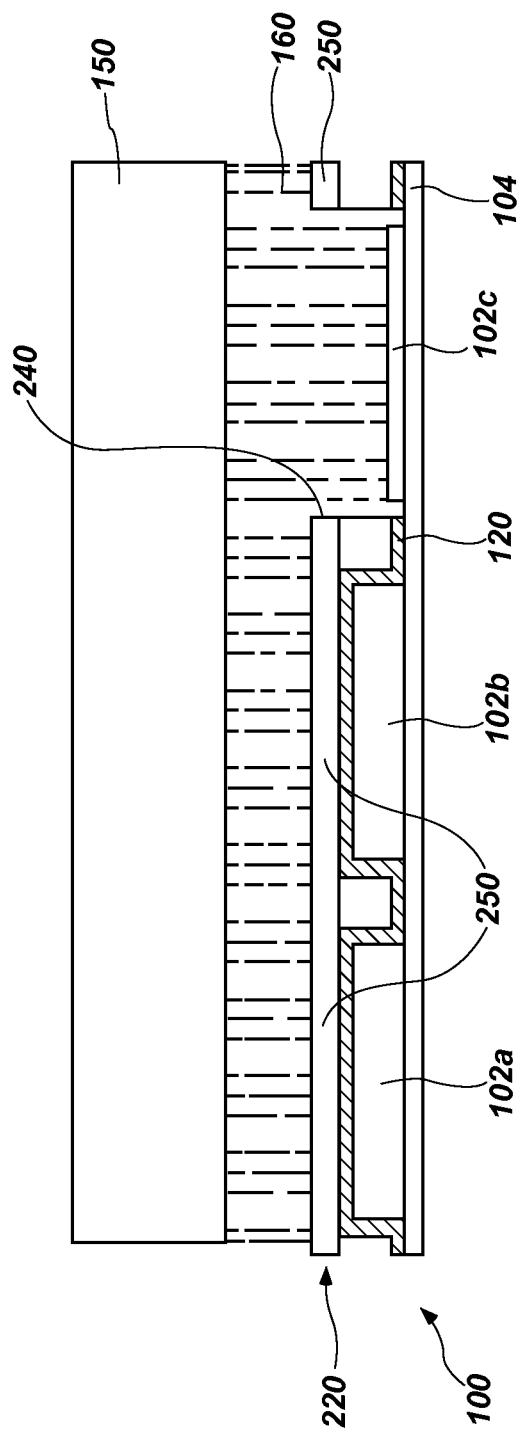
FIG. 2 illustrates use of a removal element and a template to control removal of selected portions of the protective coating (i.e., the portions that are exposed through openings in the template)

The removal element 150 may include a laser, in which case the removal medium 160 is a laser beam. In such an embodiment, the removal element 150 may comprise a diode-pumped solid-state (DPSS) laser that outputs a narrow laser beam having a wavelength of 266 nm. Alternatively, the removal element 150 may comprise an excimer laser that outputs a laser beam having a wavelength of 248 nanometers. An excimer laser may be used to provide a wide beam that may be used in conjunction with a template 220 (FIG. 2).

Alternatively, the removal element 150 may comprise an abrasive dispenser, which may be configured to dispense (e.g., through a nozzle (e.g., a nozzle with a diameter of about 0.25 mm in diameter to about 1.5 mm in diameter, etc.), etc.) a removal medium 160 comprising an abrasive material. An abrasive removal medium 160 may be, for example, an abrasive material such as solid carbon dioxide (commonly referred to as "dry ice"), sand, starch, beads, or other suitable abrasive material.

In another embodiment, the removal element may comprise a liquid dispenser, which may be configured to deliver a jet or high pressure curtain of a liquid removal medium 160. A liquid removal medium 160 may be supercritical (i.e., above its critical temperature and critical pressure). In other embodiments using liquid carbon dioxide, the carbon dioxide may be high pressure carbon dioxide above its critical pressure.

The removal element 150 may be focused such that the removal medium 160 is selectively applied to the protective coating 120. The removal element 150 may thus apply the removal medium 160 in a directional manner that can be focused on one or more components 102 without damaging portions of the protective coating 120 that are to remain over other components or features 102*a*, 102*b*, etc., of the substrate 100. The removal element 150 may, therefore, remove the protective coating 120 from only certain components or features 102*a-c*. In some embodiments, the removal medium 160 may be directed onto locations of the protective coating 120 that are directly over or adjacent to locations that are directly over a periphery of an area of the substrate 100, such as the component or feature 102*c*, to enable cutting a portion of the protective coating 120 located over such an area from the remainder of the protective coating 120. In another embodiment, the removal medium 160 may impact the protective coating 120 in a raster scanning fashion, in which the focused removal medium 160 is translated back and forth, over the portion of the protective coating 120 that is to be removed from the substrate 100.

In such embodiments, the removal element 150 may include or be used in conjunction with (e.g., be coupled, etc.) a positioning mechanism 170 that positions a removal medium-emitting part of the removal element 150 over appropriate areas of the protective coating 120 and the substrate 100. The positioning mechanism 170 may include a plotter, a raster scanner, a robotic arm or any other mechanism suitable for automated positioning of the removal medium-emitting part of the removal element 150 at an appropriate location over an x-y plane (and, optionally, along the z-axis) in which the protective coating 120 is generally located, including portions of the protective coating 120 that are to be removed. In other embodiments, the removal medium-emitting part of the removal element 150 may be stationary and a positioning mechanism 170 may be configured to move the substrate 100 relative to the removal medium-emitting part of the removal element 150.

Alternatively, movement or scanning of the removal element 150 over the protective coating 120 may be performed manually; e.g., as it is held in an individual's hand.

FIG. 2 illustrates one embodiment of a removal element 150 that is configured to apply the removal medium 160 onto a protective coating 120 in an unfocussed manner (e.g., non-selectively, etc.). In order to prevent the removal medium 160 from removing portions of the protective coating 120 that are to remain in place over certain components or features 102a-c of the substrate 100, a template 220 may be used in conjunction with unfocused removal processes. The template 220 may expose the components or features 102a-c (in FIG. 2, the component or feature 102c) to the removal medium 160, and shield the remaining portions of the protective coating 120 (e.g., those portions that overlie components or features 102a-c (in FIG. 2, the components or features 102a and 102b) from the removal medium 160. Accordingly, the template 220 may comprise a solid structure 250 through which one or more apertures 240 are defined, with the apertures 240 being located to expose predetermined portions of a protective coating 120 to the removal medium 160, while the solid structure 250 shields portions of the protective coating 120 that are to remain in place, and prevents the removal medium 160 from removing those portions of the protective coating 120.

The nature and construction of the template 220 may depend upon the removal element 150 and the removal medium 160 that are to be employed. For example, where the removal medium 160 is an abrasive material, the solid structure 250 of the template 220 may be configured, or even optimized, to resist degradation by the abrasive action of the removal medium 160. Where the removal medium 160 is laser light, the solid structure 250 may be configured to withstand the laser light and, optionally, to effectively dissipate the energy of the laser light without damaging underlying portions of the protective coating 120 and underlying components or features 102a-c of the substrate 100 that are shielded by the template 220. Use of a template 220 with an unfocused removal medium 160 (e.g., a wide laser beam; a jet, curtain or wide stream of abrasive material; a wide jet or high pressure curtain of liquid; etc.) may enable fast removal of a portion of the protective coating 120 exposed through an aperture 240 of the template 220.

Figure 3A:
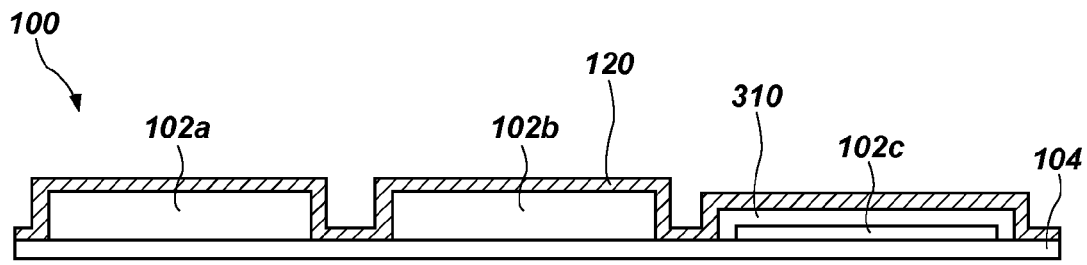
FIGS. 3A and 3B illustrate a removal element that cuts a protective coating to facilitate removal of the protective coating from a component, a feature or a portion thereof.
Figure 3B:
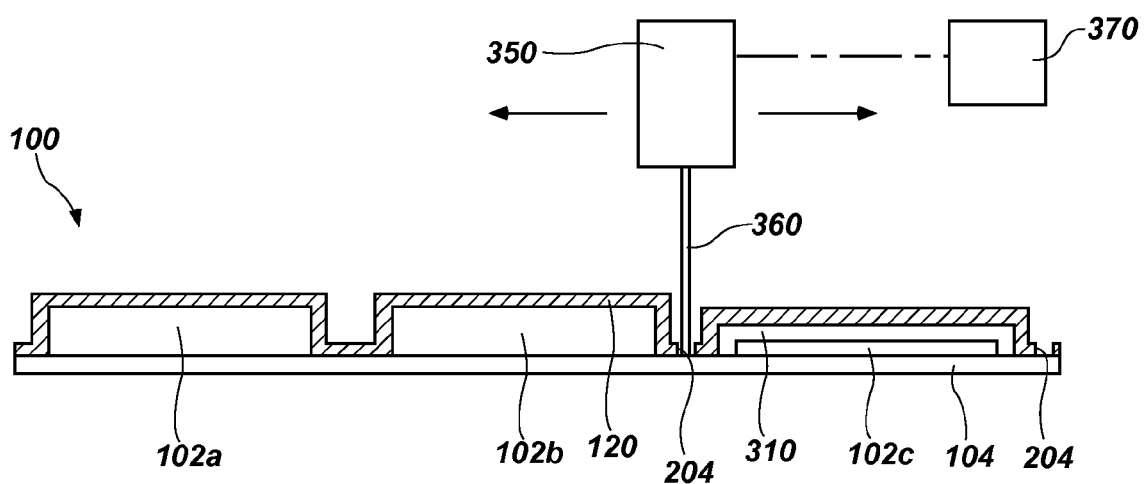

FIGS. 3A and 3B illustrate a substrate 100—a subassembly of an electronic device—with a protective coating 120 on at least a portion of a surface of the substrate 100. A mask 310, which may comprise a mask material or a release agent, is interposed between a component 102c of the substrate 100 and the protective coating 120. In certain embodiments, the substrate 100 may include some components or features 102 that are masked, and other components or features 102 that are not masked.

As illustrated by FIG. 3B, a removal element 350 (e.g., a laser, etc.) may apply (e.g., direct, etc.) a removal medium 360 (e.g., a laser beam, etc.) to the protective coating 120 to cut the protective coating 120 at location 204, around the perimeter of the mask 310. A mask 310 may be useful in situations where the mask 310 may protect a component or feature 102c while one or more portions of the protective coating 120 are being removed. For example, a display of an electronic device may be sufficiently large that it is more cost effective to mask the display, apply the protective coating 120, and then apply a focused removal medium 360 to the protective coating 120 to cut the protective coating 120 at location 204 around the perimeter of the mask 310, which protects the display from the focused removal medium 360. The mask 310 can then be peeled back, exposing the display without damaging portions of the protective coating 120 that are located over the other components 102a and 102b of the electronic device.

When a laser is used as the removal element 350 and a laser beam as the removal medium 360, The laser may be connected to a positioning mechanism 370 that positions the laser in a first position over a portion of the protective coating 120 that is to be removed from the substrate 100. The laser may then discharge the laser beam and ablate the protective coating 120. As the laser discharges the laser beam, the positioning mechanism 370 may move the laser over the protective coating 120 until a desired location 204 of the protective coating 120 (e.g., locations around the periphery of a portion that is to be removed, locations around the periphery of the mask 310, etc.) has been cut. The laser may be configured to discharge the laser beam continuously or in a pulsed manner.

Where the laser is being used to cut the protective coating 120 at locations 204 around the perimeter of a mask 310, the laser may provide a continuous laser beam as the positioning mechanism 370 moves the laser. When the laser is positioned to remove a portion of a protective coating 120 that overlies a component or feature 102c that is not protected by a mask 310; i.e., that is directly coated with the protective coating 120, the laser may generate a pulsed laser beam. Certain components or features 102c may be sufficiently large that multiple pulses of a laser beam may be needed to ablate the protective coating 120 in a manner that will facilitate removal of a portion of the protective coating 120 over those components or features 102c.

After a first portion of the protective coating 120 has been cut, with the laser in a non-discharge state, the positioning mechanism 370 may move the laser from a first position over the protective coating 120 to a second position over the protective coating 120, from which a second portion of the protective coating 120 will ultimately be removed. Once the laser is in the second position, it may again discharge the laser beam to ablate the protective coating 120 to facilitate removal of the second portion from the substrate 100. The positioning mechanism 370 may continue to move the laser until each selected portion of the protective coating 120 has been cut to facilitate its removal.

While FIG. 3B illustrates use of a laser as the removal element 350, other types of removal elements may also be used. For example, a micro-abrasive blasting machine may be equipped with a small nozzle of about 7 mils (i.e., 0.007 inch or about 0.018 mm) to about 60 mils (i.e., 0.060 inch or about 1.5 mm) in diameter to deliver a fine stream of an abrasive removal medium 360, such as dry ice. The stream of removal medium 360 may be sufficiently fine cut to the protective coating 120 at location 204. As another alternative, a blade or another mechanical cutting tool may be used to cut or remove material from the protective coating 120. In other embodiments, a heated element, such as a heated tip (e.g., a soldering iron, etc.) heated to a sufficient temperature may cut the protective coating 120 at location 204. The heated tip may trace around the desired area (e.g., around the periphery of the mask 310, etc.), cutting the protective coating 120 and enabling a portion of the protective coating 120 to be removed. A stamp with a perimeter edge that is slightly larger than the perimeter of the mask 310 may be pressed into the protective coating 120 to cut the protective coating around the periphery of the mask 310.

In embodiments where a heated tip or stamp is used to cut a parylene protective coating 120, the heated tip or stamp may be heated to a temperature of approximately 190° C. In another embodiment, the heated tip or stamp may be heated to a temperature of approximately 400° C. In another embodiment, the heated tip or stamp may be heated to a temperature of about 375° C. to about 475° C.

The heated tip may have a diameter of about 1 mm, about 2 mm or between about 1 mm and about 2 mm. A tip-to-shaft slope range for the heated tip may be between 3.5 and 5; in one specific embodiment, the tip-to-shaft slope range is approximately 3.69. The heated tip may be moved around the perimeter at a speed of about 0.8 cm/s to about 5 cm/s and, in one specific embodiment, is moved at approximately 3 cm/s. The heated tip may be applied with a force of about 0.5 Newtons (N) to about 1.33 N, and may be applied with a force of 1 N in one specific embodiment. The heated tip may be constructed from stainless steel. In one embodiment, the heated tip is a Gordak 900M T-B, a Fasten al Part 0828976 or a Wahl 7992 soldering tool. While the above dimensions and application details are given in connection with a heated tip, similar dimensions and application details may be applied to the edges of a heated stamp.

Figure 4:
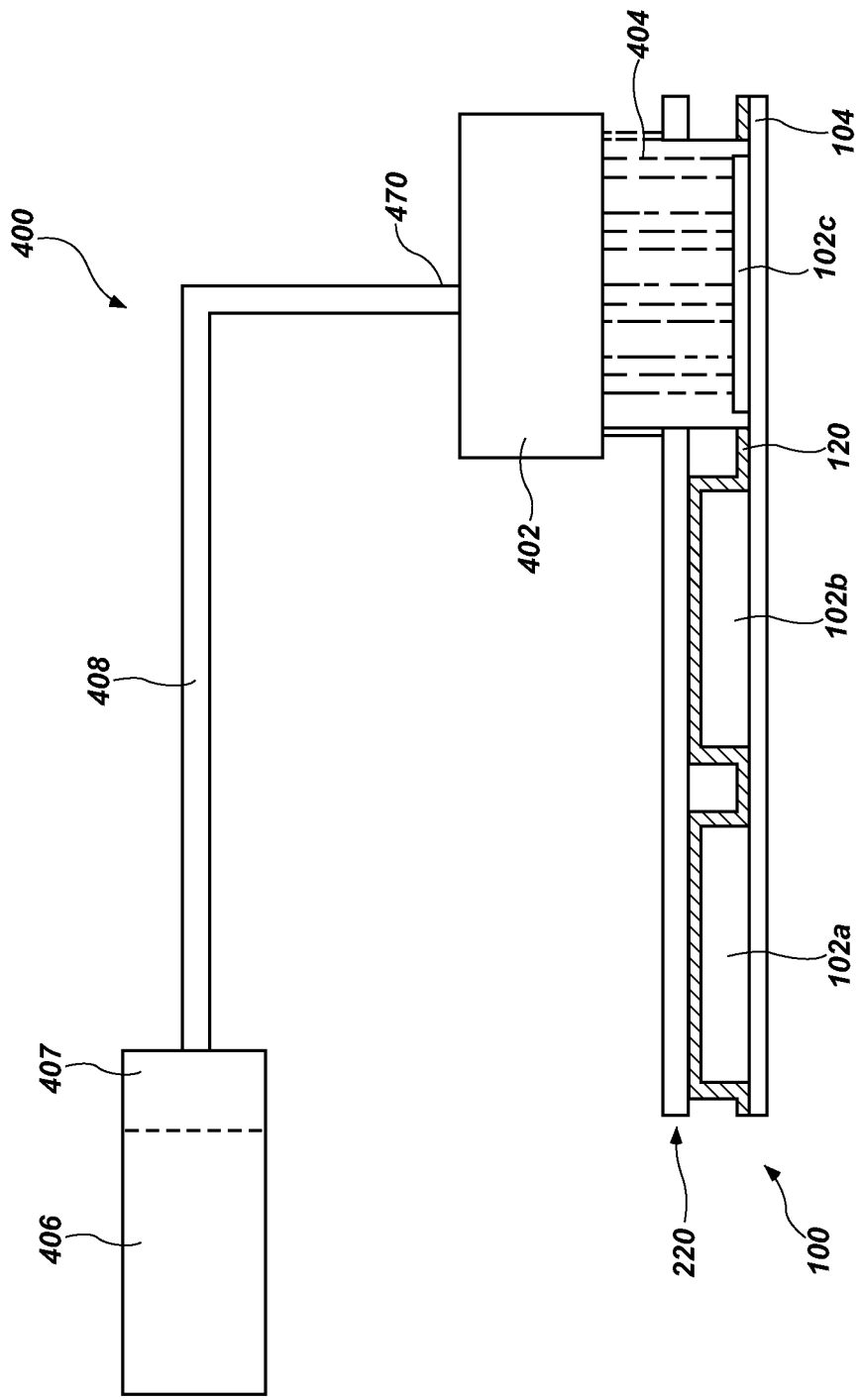
FIG. 4 schematically depicts an embodiment of a system for removing a protective coating from select areas of a substrate.

FIG. 4 illustrates a specific embodiment of a removal element 400 that employs dry ice to facilitate the removal of a portion of a protective coating 120 from a substrate 100. The removal element 400 includes a containment unit 406, a tube 408, and a nozzle 402 for an abrasive removal medium 404 to selected locations on protective coating 120. The abrasive removal medium 404 may comprise dry ice or any other suitable material, such as starch, sand, or another abrasive material. Dry ice sublimates and leaves no chemical residue on the protective coating 120 or the substrate 100.

The abrasive removal medium 404 may initially be stored in the containment unit 406. When the abrasive removal medium 404 comprises dry ice, it may initially be provided to the containment unit 406 in solid pellet form or block form. The containment unit 406 may be configured to maintain the abrasive removal medium 404 under desired conditions (e.g., temperature, pressure, etc.).

An accelerator 407 may be associated with the containment unit 406 of the removal element 400 to accelerate the abrasive removal medium 404 from the containment unit 406 through the nozzle 402. In embodiments where the removal element 400 is configured to use dry ice, the containment unit 406 may be configured to break the dry ice into small pieces and combine it with compressed air when delivery of the dry ice is desired. The compressed air transports the dry ice through the tube 408 to the nozzle 402, which may direct the dry ice toward the substrate 100 and the protective coating 120 thereon. The tube 408 may comprise a single tube, or hose, for delivering the compressed air and dry ice, or it may comprise a pair of tubes, or hoses, with one tube configured to deliver compressed air and the other tube configured to transport dry ice to the nozzle 402.

In a specific embodiment, the nozzle 402 is an 8 mm diameter nozzle and dry ice is discharged at a feed rate of about 1 pound per minute (lb/min) (i.e., about 0.45 kg/min) at a pressure of 40 psi (i.e., about 275 kPa or about 2.8 kgf/cm$^2$). The nozzle 402 may, in certain embodiments, be a diffuser nozzle that further cuts and reduces the particle size of the dry ice before it is expelled toward the substrate 100. Each or any combination of the nozzle 402, the feed rate of dry ice and the air pressure may be varied from the examples given above; in a mass production setting, the feed rate and the pressure may be higher or lower than the values given above. Similarly, the size of the nozzle 402 may vary based on the size of the area from which the protective coating 120 is removed. In certain embodiments, a removal element 400 may include multiple nozzles 402 of multiple diameters, which may be selected on the basis of the area of a portion of the protective coating 120 that is to be removed from a substrate 100.

A template 220 may be used with the removal element 400 to ensure that the abrasive removal medium 404 (e.g., dry ice, etc.) does not strike or damage locations of the protective coating 120 that are to remain on the substrate 100. The template 220 may shape a spray, jet or stream of abrasive removal medium 404 in a manner that provides it with a wide contact front, which may decrease processing time. In other embodiments, a template 220 may be used even when the abrasive removal medium 404 is focused as an additional precaution to protect portions of the protective coating 120 that are to remain on the substrate 100. The template 220 may also be used to protect components that may be damaged by the abrasive removal medium 404, such as polycarbonate components, foam, or ribbon cables.

The abrasive removal medium 404 may be used to cut around a mask 310, as discussed in reference to FIG. 3. In such an embodiment, the template 220 may include an aperture 240 that substantially aligns with the periphery of the mask, or with the periphery of the masked component or feature 102c.

The nozzle 402 of the removal element 400 may be mounted to a positioning mechanism 470, which may move the nozzle 402 to one or more predetermined locations over the substrate 100 and the protective coating 120 thereon, enabling the abrasive removal medium 404 expelled from the nozzle 402 to cut or remove certain locations of the protective coating 120. Once the abrasive removal medium 404 cuts the protective coating 120, the cut portion of the protective coating 120 may then be removed from the substrate 100. Any suitable removal process may be used. Without limitation, cut portions of the protective coating 120 may be picked from the substrate 100, they may be blown off of the substrate with a pressurized medium (e.g., air, an inert gas, etc.) or they may be removed by any other suitable technique.

The removal element 400 may be implemented as a blast cabinet, a blast room, or any other suitable environment. The removal element 400 may be implemented as a station in an assembly line, and positioned downstream from a coating station that applies protective coatings 120 to substrates 100.

Figure 5:
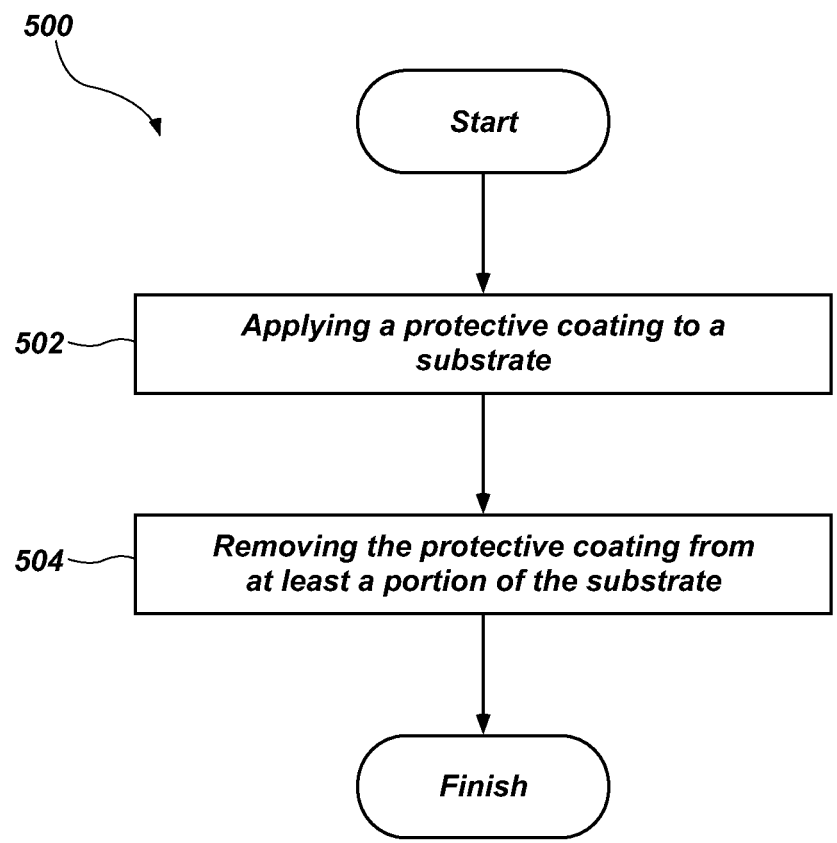
FIG. 5 is a flow chart depicting process flow of an embodiment of a method for selectively removing portions of a protective coating from a substrate.

FIG. 5 illustrates an embodiment of a method 500 for applying a protective coating 120 (see, e.g., FIG. 1B) to selected portions of a substrate 100 (see, e.g., FIG. 1B). The method 500 may include applying a protective coating 120 to a plurality of components or features 102 (see, e.g., FIG. 1B) of the substrate 100, at reference numeral 502. The protective coating 120 may be applied, for example, to surface mount technology (SMT) components on a PCB, a display, aesthetic components (such as an exterior decorative strip of metal), or other components. The protective coating may be applied using any suitable deposition technique.

The method 500 also includes removing portions of the protective coating 120 from the substrate 100 (e.g., from locations over a subset of the plurality of components or features 102, etc.). In embodiments where the substrate 100 is an electronic device, the protective coating 120 may, for example, be removed from a display, from ports, from battery terminals or other electrical contacts, or from other components, at reference numeral 504.

Where one or more components are masked, the method may include removing locations of the protective coating 120 over a mask 310, adjacent to a periphery of the mask 310. When such an approach is used, the mask 310 may protect the substrate 100. Alternatively, the method 500 may include removing locations of the protective coating 120 that are located just outside of the periphery of a mask 310, which may enable removal of the mask 310 without risking unnecessary damage to the portions of the protective coating 120 that remain. A substrate 100 may have some components or features 102 that are masked and other components or features 102 that are unmasked, but that will ultimately be exposed through the protective coating 120; in such embodiments, the method 500 may involve removing the protective coating 120 from the directly coated components or features 102 and tracing around the perimeter of masked components or features 102.

Figure 6:
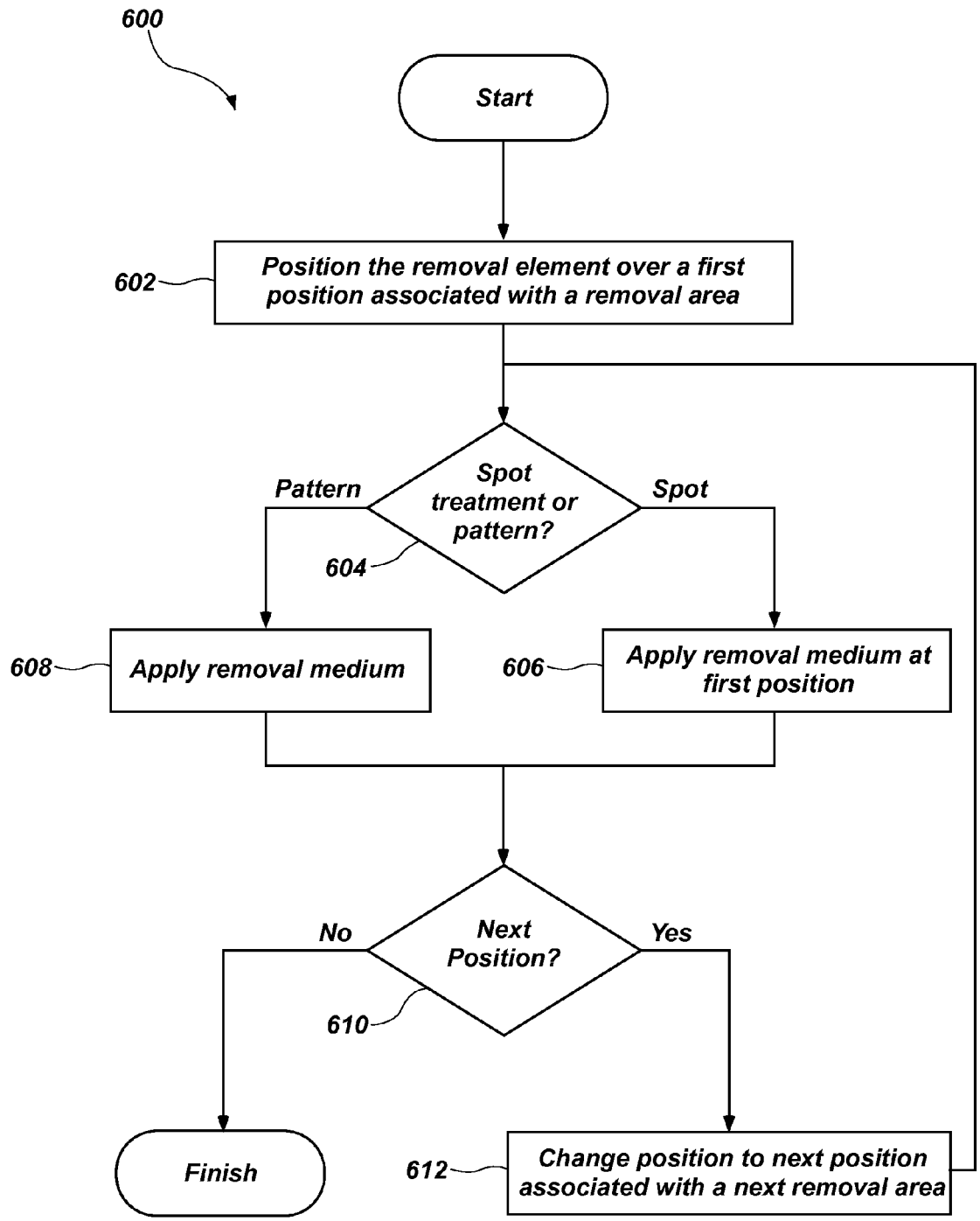
FIG. 6 is a flow chart illustrating process flow of an embodiment of a method for selectively removing a protective coating from multiple discrete areas of a substrate.

FIG. 6 illustrates an embodiment of a method 600 for removing a protective coating 120 (FIG. 1C) from an electronic device. The method 600 begins at reference numeral 602 with positioning the removal element (FIG. 1C) over a first position associated with a removal area. The removal element 150 may be connected to a positioning mechanism coupled to a processor and memory storing instructions for moving the removal element 150. The memory may also include instructions for the timing for dispersing a removal medium (FIG. 1C) (for example, whether to emit a pulse or a continuous stream).

The method 600 may continue at reference numeral 604 with determining whether the removal element is to perform a spot treatment at the first position (i.e., to remove the protective coating 120 at the first location) (FIG. 1C) or to perform a pattern (e.g., providing a continuous stream while the positioning mechanism 120 traces a pre-programmed pattern, etc.). If the first position is associated with a spot treatment, the removal element 150 may apply the removal medium 160 at the first position, as indicated at reference numeral 606. If the first position is associated with a pattern, the removal element 150 may apply the removal medium while the positioning mechanism 170 executes the pattern. In this manner, the method 600 may provide for removing the protective coating 120 from discrete components that can be treated with a spot treatment, larger components requiring movement, and more complex patterns such as traces around a masked component.

The method 600 may also include, at reference numeral 610, determining whether or not there is a next position. If so, the position of the removal element 150 may be changed from the current position to the next position that is associated with the next removal area, and a determination may be made as to whether or not the next removal area requires a spot treatment or execution of a pattern, at reference numeral 612. The method 600 may be repeated until all positions have been appropriately treated.

Although the foregoing disclosure provides many specifics, these should not be construed as limiting the scope of any of the ensuing claims. Other embodiments may be devised which do not depart from the scopes of the claims. Features from different embodiments may be employed in combination. The scope of each claim is, therefore, indicated and limited only by its plain language and the full scope of available legal

What is claimed:

1. A method for selectively applying a moisture-resistant protective coating to an electronic device subassembly, comprising:
    applying a moisture-resistant protective coating comprising poly(p-xylylene) to one or more electronic components of the electronic device subassembly; and
    dispensing a removal medium comprising particulate solid carbon dioxide on at least one selected portion of the moisture-resistant protective coating on the one or more electronic components of the electronic device subassembly to selectively remove the at least one selected portion of the moisture resistant protective coating to expose at least one selected component or feature through the moisture-resistant protective coating.

2. The method of claim 1, wherein the electronic device subassembly is configured to be installed inside an electronic device.

3. The method of claim 1, wherein dispensing the removal medium comprises exposing an entirety of the at least one selected portion of the moisture-resistant protective coating to the removal medium.

4. The method of claim 1, wherein dispensing the removal medium comprises exposing a periphery of the moisture-resistant protective coating to the removal medium.

5. The method of claim 1, further comprising:
    aligning and positioning a template over the protective coating with the at least one selected portion of the protective coating exposed through an aperture in the template before dispensing the removal medium on the at least one selected portion of the protective coating.

6. A method for selectively applying a moisture-resistant protective coating to an electronic device subassembly, comprising:
    applying a moisture-resistant protective coating comprising poly(p-xylylene) to one or more electronic components of the electronic device subassembly; and
    positioning a removal tool or the electronic device subassembly relative to each other such that the removal tool is at a given position relative to at least one selected portion of the moisture-resistant protective coating and using the removal tool to direct a removal medium comprising particulate solid carbon dioxide onto the at least one selected portion of the moisture-resistant protective coating to selectively remove the at least one selected portion of the moisture-resistant protective coating and expose at least one selected component or feature through a remainder of the moisture-resistant protective coating.

7. The method of claim 6, wherein positioning the removal tool or the electronic device subassembly relative to each other comprises manually positioning the removal tool or the electronic device subassembly.

8. The method of claim 6, further comprising:
    aligning and positioning a template over the protective coating with the at least one selected portion of the protective coating exposed through an aperture in the template.

9. The method of claim 6, wherein positioning the removal tool or the electronic device subassembly relative to each other comprises automatically moving the removal tool or the electronic device subassembly while using the removal tool to direct the removal medium onto the at least one selected portion of the protective coating.

10. A method for selectively applying a moisture-resistant protective coating to an electronic device subassembly, comprising:
   applying a moisture-resistant protective coating to a plurality of components and features of the subassembly configured to be installed inside an electronic device; and
   automatedly moving a removal tool or the electronic device subassembly relative to each other to position the removal tool over at least one selected portion of the protective coating while using the removal tool to direct an abrasive removal medium comprising particulate solid carbon dioxide onto the at least one selected portion of the protective coating to selectively remove the at least one selected portion of the protective coating from at least one selected component or feature of the plurality of components and features of the subassembly and to expose the at least one selected component or feature through a remainder of the protective coating.

11. The method of claim 10, wherein using the removal tool to direct the abrasive removal medium onto the at least one selected portion of the protective coating comprises using the removal tool to direct a focused stream of the particulate solid carbon dioxide onto the at least one selected portion of the protective coating.

12. The method of claim 10, wherein applying the protective coating comprises applying a moisture-resistant coating to the plurality of components and features of the subassembly.

13. The method of claim 12, wherein applying the protective coating comprises applying a poly(p-xylylene) coating to the plurality of components and features of the subassembly.

14. The method of claim 1, wherein dispensing a removal medium comprises dispensing the particulate solid carbon dioxide at a feed rate of about 1 pound per minute.

15. The method of claim 1, wherein dispensing a removal medium comprises dispensing the particulate solid carbon dioxide at pressure of about 40 psi.

16. The method of claim 1, wherein dispensing a removal medium comprises dispensing the particulate solid carbon dioxide with a diffuser nozzle.

17. The method of claim 1, wherein dispensing a removal medium comprises dispensing the removal medium through a nozzle having a diameter of about 0.018 mm to about 8 mm.

18. The method of claim 1, wherein applying a moisture-resistant protective coating comprises applying a moisture-resistant protective coating to one or more electronic components positioned on a printed circuit board of the electronic device subassembly, and wherein dispensing a removal medium comprises dispensing the removal material on the one or more electronic components positioned on the printed circuit board.

19. The method of claim 1, wherein the removal medium is dispensed from a removal element, and wherein the method further comprises automatically moving the removal element or the electronic device subassembly relative to one another while dispensing the removal material.

20. The method of claim 19, automatically moving the removal element or the electronic device subassembly relative to one another comprises moving the removal element or the electronic device subassembly in a scanning motion relative to one another.

21. The method of claim 1, wherein dispensing the removal medium comprises dispensing a focused stream of the particulate solid carbon dioxide.

22. The method of claim 1, wherein the one or more electronic components of the electronic device subassembly comprise one or more completed functionable electronic components.

23. The method of claim 22, wherein the one or more completed functionable electronic components comprise a processor, a microcontroller, or a memory device.

24. The method of claim 6, wherein using the removal tool to direct a removal medium comprises dispensing the particulate solid carbon dioxide from the removal tool at a feed rate of about 1 pound per minute.

25. The method of claim 6, wherein using the removal tool to direct a removal medium comprises dispensing the particulate solid carbon dioxide at pressure of about 40 psi.

26. The method of claim 6, wherein using the removal tool to direct a removal medium comprises dispensing the particulate solid carbon dioxide through a diffuser nozzle.

27. The method of claim 6, wherein the one or more electronic components of the electronic device subassembly comprise one or more completed functionable electronic components.

28. The method of claim 27, wherein the one or more completed functionable electronic components comprise a processor, a microcontroller, or a memory device.

* * * * *